US012713630B2

(12) United States Patent
Tseng et al.

(10) Patent No.: US 12,713,630 B2
(45) Date of Patent: Aug. 18, 2026

(54) WAFER LEVEL PACKAGING PROCESS FOR THIN FILM INDUCTORS

(71) Applicant: QUALCOMM Incorporated, San Diego, CA (US)

(72) Inventors: Anshih Tseng, Fremont, CA (US); Peng Zou, Camas, WA (US); Joseph Dibene, Watsonville, CA (US); Gerard Williams, Newport Coast, CA (US)

(73) Assignee: QUALCOMM Incorporated, San Diego, CA (US)

(*) Notice: Subject to any disclaimer, the term of this patent is extended or adjusted under 35 U.S.C. 154(b) by 371 days.

(21) Appl. No.: 18/531,488

(22) Filed: Dec. 6, 2023

(65) Prior Publication Data

US 2024/0258364 A1 Aug. 1, 2024

Related U.S. Application Data

(60) Provisional application No. 63/482,745, filed on Feb. 1, 2023.

(51) Int. Cl.

| | |
|---|---|
| ***H10D 1/20*** | (2025.01) |
| ***H01F 27/28*** | (2006.01) |
| ***H10W 90/00*** | (2026.01) |
| *H10W 72/00* | (2026.01) |
| *H10W 72/20* | (2026.01) |

(52) U.S. Cl.

CPC ........... *H10D 1/20* (2025.01); *H01F 27/2804* (2013.01); *H10W 90/00* (2026.01); *H01F 2027/2809* (2013.01); *H10W 72/012* (2026.01); *H10W 72/252* (2026.01)

(58) Field of Classification Search

CPC ...... H10D 1/20; H10W 72/012; H10W 72/20; H10W 90/00; H10W 44/501; H10W 72/90; H01F 27/2804; H01F 2027/2809; H01F 17/0006; H01F 41/32

See application file for complete search history.

(56) References Cited

U.S. PATENT DOCUMENTS

2013/0056847 A1* 3/2013 Chen ........................ H10D 1/20 257/E29.325
2020/0211958 A1 7/2020 Liu et al.
2022/0406698 A1 12/2022 Aleksov et al.

FOREIGN PATENT DOCUMENTS

WO 2020106214 A1 5/2020

OTHER PUBLICATIONS

International Search Report and Written Opinion—PCT/US2023/082855—ISA/EPO—Apr. 30, 2024.

* cited by examiner

*Primary Examiner* — Wasiul Haider
(74) *Attorney, Agent, or Firm* — Loza & Loza LLP

(57) ABSTRACT

An integrated circuit (IC) package, including an integrated circuit (IC) die including an input/output (I/O) pad, and a vertical thin-film inductor (TFI) extending vertically substantially from the I/O pad to a solder bump.

26 Claims, 12 Drawing Sheets

700-C
702
710
730
704

700-A
704
708
706
PMIC wafer 702

700-B
706
710
708
704
PMIC wafer 702

700-F
702
708
730
712

700-D
706
708
710
704
712
PMIC wafer 702

700-E
706
708
704
712
PMIC wafer 702

700-M
702
718
730

700-L
706
702
714
708
716
718
704
712
PMIC wafer

700-Q
702
722
724
730
720

700-P
722
706
712
708
724
704
720
714
PMIC wafer 702

WAFER LEVEL PACKAGING PROCESS FOR THIN FILM INDUCTORS

CROSS-REFERENCE TO RELATED APPLICATION

This application claims the benefit of the filing date of U.S. Provisional Application 63/482,745, filed on Feb. 1, 2023, which is incorporated herein by reference.

FIELD

Aspects of the present disclosure relate generally to integrated circuit (IC) packaging, and in particular, to wafer level packaging (WLP) processes for integrating integrated circuits (ICs) with thin film inductors (TFI).

BACKGROUND

An integrated circuit (IC) may be electrically coupled to one or more inductors by way of metallization traces on a printed circuit board (PCB) upon which the IC and the one or more inductors are mounted. In such arrangement, the one or more inductors may occupy significant PCB footprint, which generally drives up the cost of products incorporating such PCB with IC and one or more inductors thereon. Moreover, there may be significant electrical path lengths between the IC and the one or more inductors, which may have adverse effects on circuit performance.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC) package. The IC package includes: an integrated circuit (IC) die including an input/output (I/O) pad; and a vertical thin-film inductor (TFI) extending vertically substantially from the I/O pad to a solder bump.

Another aspect of the disclosure relates to a method of fabricating an integrated circuit (IC) package. The method includes providing an integrated circuit (IC) including an input/output (I/O) pad; forming a vertical thin-film inductor (TFI) extending vertically from substantially the I/O pad; and forming a solder bump over the vertical TFI.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figures 1, 2, 3:
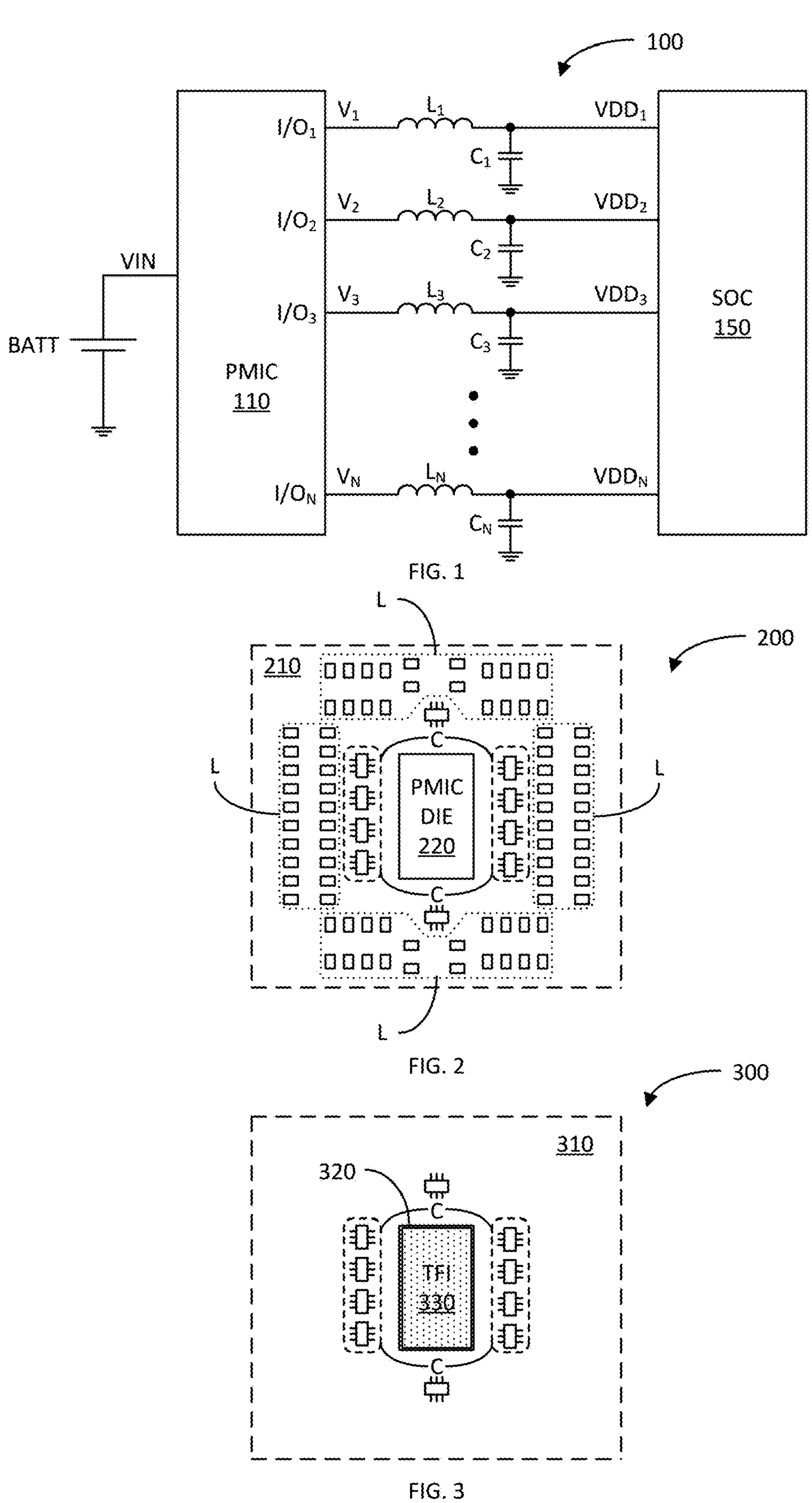
FIG. 1 illustrates a block diagram of an example power supplying circuit in accordance with an aspect of the disclosure.
FIG. 2 illustrates a top view of another example power supplying circuit in accordance with another aspect of the disclosure.
FIG. 3 illustrates a top view of another example power supplying circuit in accordance with another aspect of the disclosure.

FIG. 1 illustrates a block diagram of an example power supplying circuit 100 in accordance with an aspect of the disclosure. The power supplying circuit 100 includes a power management integrated circuit (PMIC) 110 including an input coupled to a battery (or other voltage source) to receive an input voltage VIN. The PMIC 110 may be configured to generate a set of voltages $V_1$ to $V_N$ at a set of input/output (I/O) pads $I/O_1$ to $I/O_N$ based on the input voltage VIN, respectively.

The power supplying circuit 100 further includes a set of inductors $L_1$ to $L_N$ coupled in series between the set of input/output pads $I/O_1$ to $I/O_N$ and a set of power (supply voltage) rail inputs $VDD_1$ to $VDD_N$ of an integrated circuit (IC) 150, such as a system on chip (SOC). The power supplying circuit 100 includes a set of shunt capacitors $C_1$ to $C_N$ coupled between the power rail inputs $VDD_1$ to $VDD_N$ of the SOC 150 and a lower voltage rail (e.g., ground).

The SOC 150 includes functional circuits coupled to the set of power rail inputs $VDD_1$ to $VDD_N$. The functional circuits are configured to draw dynamic currents from the PMIC 110 via the set of power rail inputs $VDD_1$ to $VDD_N$, respectively. The dynamic currents may vary relatively fast and significantly. Accordingly, if not stabilized, the set of power rail voltages $V_{DD1}$ to $V_{DDN}$ would vary significantly, adding noise and potentially causing functional problems in and/or damage to the SOC 150. Thus, the set of inductors/capacitors $L_1/C_1$ to $L_N/C_N$ assists in maintaining the power rail voltages $V_{DD1}$ to $V_{DDN}$ substantially stable notwithstanding the dynamic current demands from the SOC 150.

FIG. 2 illustrates a top view of another example power supplying circuit 200 in accordance with another aspect of the disclosure. The power supplying circuit 200 may be an example of a physical implementation of at least a portion of the power supplying circuit 100 previously discussed. The power supplying circuit 200 includes a PMIC die 220 mounted on a printed circuit board (PCB) 210. The PMIC die 220 may correspond to the PMIC 110 of power supplying circuit 100.

The power supplying circuit 200 also includes a set of inductors L (delineated by a dotted-line surrounding the inductors L) and a set of capacitors C (delineated by a short dashed-line surrounding the capacitors C). The sets of inductors L and capacitors C are mounted on the PCB 210 near and generally surrounding the PMIC die 220. The sets of inductors L and capacitors C may correspond to the sets of series inductors $L_1$ to $L_N$ and shunt capacitors $C_1$ to $C_N$ of power supplying circuit 100, respectively.

A drawback of the power supplying circuit 200 is that the sets of inductors L and capacitors C occupy significant footprint of the PCB 210, which generally increases the costs of the power supplying circuit 200 and/or restricts the number of components that can be mounted on the PCB 210. Another drawback of the power supplying circuit 200 is that there are considerable electrical path lengths between the PMIC die 220 and the sets of inductors L and capacitors C, which generally has adverse effects on the stabilization, noise, and other performance characteristics associated with the set of supply voltages $VDD_1$ to $VDD_N$ provided to the SOC 150.

FIG. 3 illustrates a top view of another example power supplying circuit 300 in accordance with another aspect of the disclosure. The power supplying circuit 300 may be an example of a physical implementation of the power supplying circuit 100 previously discussed. The power supplying circuit 300 includes a PMIC die 320 mounted on a printed circuit board (PCB) 310. The PMIC die 320 may correspond to the PMIC 110 of power supplying circuit 100.

The power supplying circuit 300 also includes a set of capacitors C (delineated by a short dashed line surrounding the capacitors C). The power supplying circuit 300 includes an array or set of horizontal thin-film inductors (TFIs) 330 formed on top of the PMIC die 320. The set of horizontal TFIs 330 and the set of capacitors C may correspond to the sets of series inductors $L_1$ to $L_N$ and shunt capacitors $C_1$ to $C_N$ of power supplying circuit 100, respectively.

An advantage of the power supplying circuit 300 over the power supplying circuit 200 is that the set of horizontal TFIs 330 are formed on the PMIC die 320; and thereby, does not occupy any additional PCB footprint. Thus, the costs of the power supplying circuit 300 may be reduced compared to the power supplying circuit 200. Additionally, as the set of horizontal TFIs 330 are situated on top of the PMIC die 320, the electrical path lengths between the I/O pads of the PMIC die 320 and the set of horizontal TFIs 330 are substantially shorter compared to that of the power supplying circuit 200. Thus, the stabilization, noise, and other performance characteristics associated with the set of supply voltages $VDD_1$ to $VDD_N$ provided to the SOC 150 may be significantly improved.

Figure 4A:
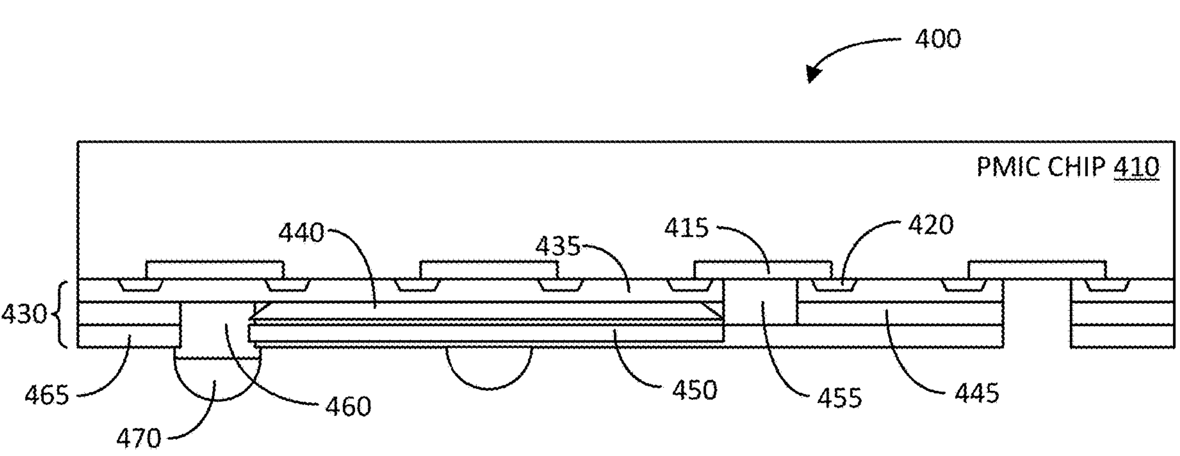
FIG. 4A illustrates a side cross-sectional view of an example integrated circuit (IC) package including a horizontal thin-film inductor (TFI) in accordance with another aspect of the disclosure.

FIG. 4A illustrates a side cross-sectional view of an example integrated circuit (IC) package 400 in accordance with another aspect of the disclosure. The IC package 400 includes an IC die or chip 410, such as, for example, a power management integrated circuit (IC) die or chip or other. The PMIC die 410 includes at least one input/output (I/O) metal pad 415 (e.g., formed on a top metal layer commonly referred to as an aluminum layer (AP)), and a top passivation layer 420 covering the top of the PMIC die 410 except to expose portions of the at least one I/O pad 415.

Although in this view, the PMIC die 410 is flipped up-side-down (e.g., the reason for referring to the I/O pad 415 and the passivation layer 420 as being at the top of the PMIC die 410), it shall be understood that the orientation of the IC die 410 (or any IC die or package described herein) and other components coupled thereto are not critical; and thus, terms such as a material is formed over or on a component could mean that such material may be situated below the component depending on the orientation of the IC package 400 or other structures described herein.

The IC package 400 further includes a thin-film inductor (TFI) structure 430 coupled or attached to the PMIC die 410. As discussed further herein, the TFI structure 430 includes a TFI and electrical connection for electrically coupling the I/O pad 415 of the PMIC die 410 to a solder bump or ball 470 of the IC package 400. The solder bump or ball 470 may be used to electrically couple and mount the IC package 400 to a printed circuit board (PCB). More specifically, the TFI structure 430 includes a first electrical insulating (dielectric) layer 435 (e.g., silicon oxide ($SiO_2$), silicon nitride ($Si_3N_4$), polymer (e.g., polyimide, polybenzoxazoles (PBO), or other) disposed over or on the at least one I/O pad 415 and the passivation layer 420 of the PMIC die 410.

The TFI structure 430 further includes a first magnetic layer 440 (e.g., cobalt, zirconium, tantalum (CTZ), cobalt, zirconium, tantalum, boron (CZTB), CZT+tantalum (Ta), CZT+CZT oxide, nickel-iron (NiFe)+Ta, or other) formed over or on the first electrical insulating layer 435. The TFI structure 430 further includes a second electrical insulating (dielectric) layer 445 (e.g., $SiO_2$, $Si_3N_4$, polymer, or other) formed over the first magnetic layer 440 and the first electrical insulating layer 435. Additionally, the TFI structure 430 includes a first electrical conducting pillar 455 (e.g., a copper (Cu)) electrically coupled to the I/O pad 415 of the PMIC die 410 and extending through the first and second electrical insulating layers 435 and 445.

The TFI structure 430 further includes a second magnetic layer 450 (e.g., CZT, CZTB, CZT+Ta, CZT+CZT oxide, NiFE+Ta, or other) formed over the first magnetic layer 440 and the second electrical insulating layer 445. Additionally, the TFI structure 430 includes a passivation layer 465 (e.g., a polymer, epoxy mold compound, or other) formed over or on the second electrical insulating layer 445 and the second magnetic layer 450. Further, the TFI structure 430 includes a second electrical conducting pillar 460 (e.g., Cu) extending from the top of the first electrical insulating layer 435 through the second electrical insulating layer 445 and the passivation layer 465, and terminating substantially at the solder bump or ball 470.

Although not shown, the TFI structure 430 includes an electrical conducting layer (e.g., a redistribution layer (RDL) (e.g., Cu)) extending between the first and second magnetic layers 440 and 450, and electrically coupled on either end to the first and second electrical conducting pillars 455 and 460, respectively. The TFI structure 430 may further include an additional electrical insulating layer (e.g., an electrical insulating dome) for electrically isolating the first magnetic layer 440, the second magnetic layer 450, and the RDL from each other. The core TFI of the TFI structure 430 includes the first electrical conducting pillar 455 serving as the first terminal of the TFI, the second electrical conducting pillar 460 serving as the second terminal of the TFI, and the first and second magnetic layers, RDL, and electrical insulating layers serving as the inductive component of the TFI. Thus, the TFI is coupled in series between the I/O pad 415 of the PMIC die 410 and the solder bump or ball 470. A shunt capacitor and another integrated circuit (IC) or system on chip (SOC) may be coupled to the solder bump or ball 470 via metal traces on a printed circuit board (PCB), as discussed with reference to power supply circuits 100-300.

Figure 4B:
FIG. 4B illustrates a top view of an example integrated circuit (IC) package including an array of horizontal thin-film inductors (TFIs) in accordance with another aspect of the disclosure.
Figure 4B:
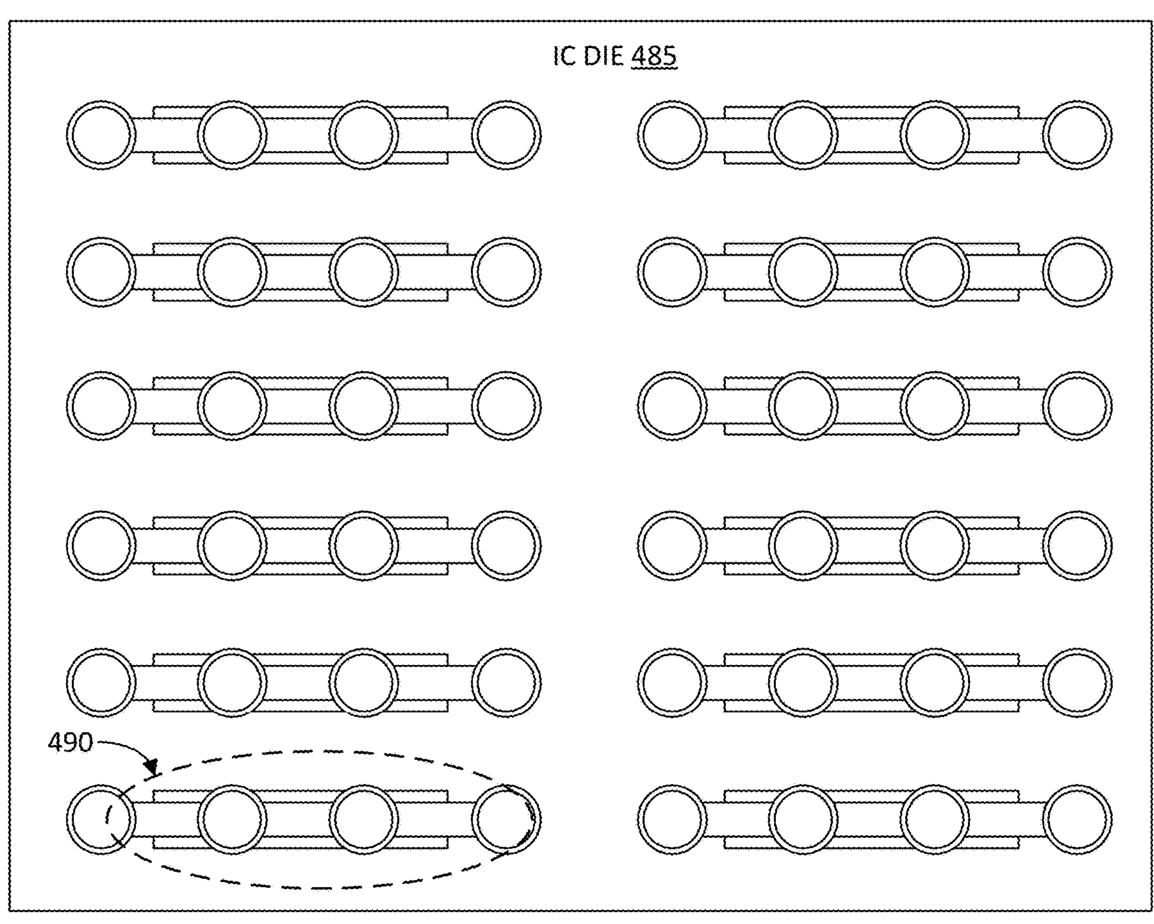

FIG. 4B illustrates a top view of another example integrated circuit (IC) package 480 in accordance with another aspect of the disclosure. The IC package 480 includes an IC die or chip 485 and an array or set of horizontal thin-film inductors (TFIs) 490 formed over or on the IC die 485. Each of the horizontal TFI in the array 490 may be implemented in accordance with the TFI structure 430 previously discussed in detail. In this example, the array of horizontal TFI structures 490 is a two (2) by six (6) dimensioned array, but it shall be understood such array may be dimensioned differently.

A drawback of the IC package 480 is that each of the TFIs of the array 490 is arranged in a horizontal manner. Even though, as previously discussed, implementing TFIs over or on an IC die 485 saves printed circuit board (PCB) footprint, such horizontal TFI arrangement occupies significant footprint on top of the IC die 485, which may prevent the implementation of higher density TFI array and/or the implementation of other components on top of the IC die 485. The following describes vertical TFIs that may be implemented over or on an IC die, which may facilitate using the area on top of an IC die in a significantly more efficient manner.

Figure 5A:
FIG. 5A illustrates a side cross-sectional view of an example integrated circuit (IC) package including an example vertical thin-film inductor (TFI) in accordance with another aspect of the disclosure.
Figure 5A:
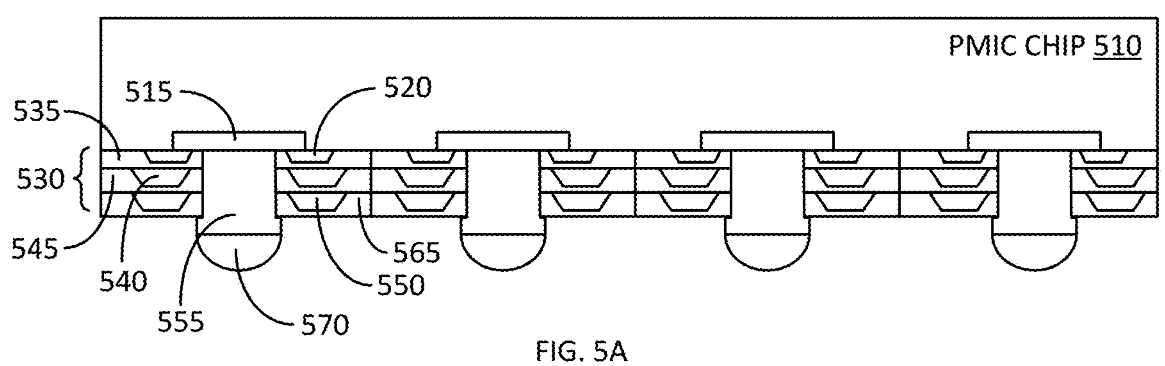

FIG. 5A illustrates a side cross-sectional view of an example integrated circuit (IC) package 500 in accordance with another aspect of the disclosure. The IC package 500 includes an IC die or chip 510, such as, for example, a power management integrated circuit (IC) die or chip, and/or other type of IC die. The PMIC die 510 includes at least one input/output (I/O) metal pad 515 (e.g., formed on a top metal layer commonly referred to as an aluminum layer (AP)), and a top passivation layer 520 covering the top of the PMIC die 510 except to expose portions of the at least one I/O pad 515.

The IC package 500 further includes at least one thin-film inductor (TFI) structure 530 (e.g., a set or array) coupled or attached to the PMIC die 510. The TFI structure 530 includes at least one TFI and electrical connection for electrically coupling the at least one I/O pad 515 of the PMIC die 510 to at least one solder bump or ball 570 of the IC package 500 via the at least one TFI, respectively. In particular, the TFI structure 530 includes a first electrical insulating (dielectric) layer 535 (e.g., $SiO_2$, $Si_3N_4$, polymer (e.g., polyimide, PBO, or other), or other) disposed over or on the at least one I/O pad 515 and passivation layer 520 of the PMIC die 510.

The TFI structure 530 further includes a first magnetic semi-ring layer 540 (e.g., CTZ, CZTB, CZT+Ta, CZT+CZT oxide, NiFe+Ta, or other) formed over or on the first electrical insulating layer 535. The TFI structure 530 further includes a second electrical insulating (dielectric) layer 545 (e.g., $SiO_2$, $Si_3N_4$, polymer, or other) formed over the first magnetic semi-ring layer 540 and the first electrical insulating layer 535. The TFI structure 530 also includes a second magnetic semi-ring layer 550 (e.g., CZT, CZTB, CZT+Ta, CZT+CZT oxide, NiFE+Ta, or other) formed over or on the second insulating layer 545 and above the first magnetic layer 540 in a substantially vertically aligned manner.

Additionally, the TFI structure 530 includes a passivation layer 565 (e.g., a polymer, epoxy mold compound, or other) formed over or on the second electrical insulating layer 545 and the second magnetic semi-ring layer 550. Further, the TFI structure 530 includes an electrical conducting pillar 555 (e.g., Cu) electrically coupled to the I/O pad 515 of the PMIC die 410, and vertically extending substantially from the I/O pad 515 to the solder bump or ball 570 through the first and second electrical insulating layers 535 and 545 and the passivation layer 565. The electrical conducting pillar 555 also extends coaxially through the first and second magnetic semi-ring layers 540 and 550.

Figure 5B:
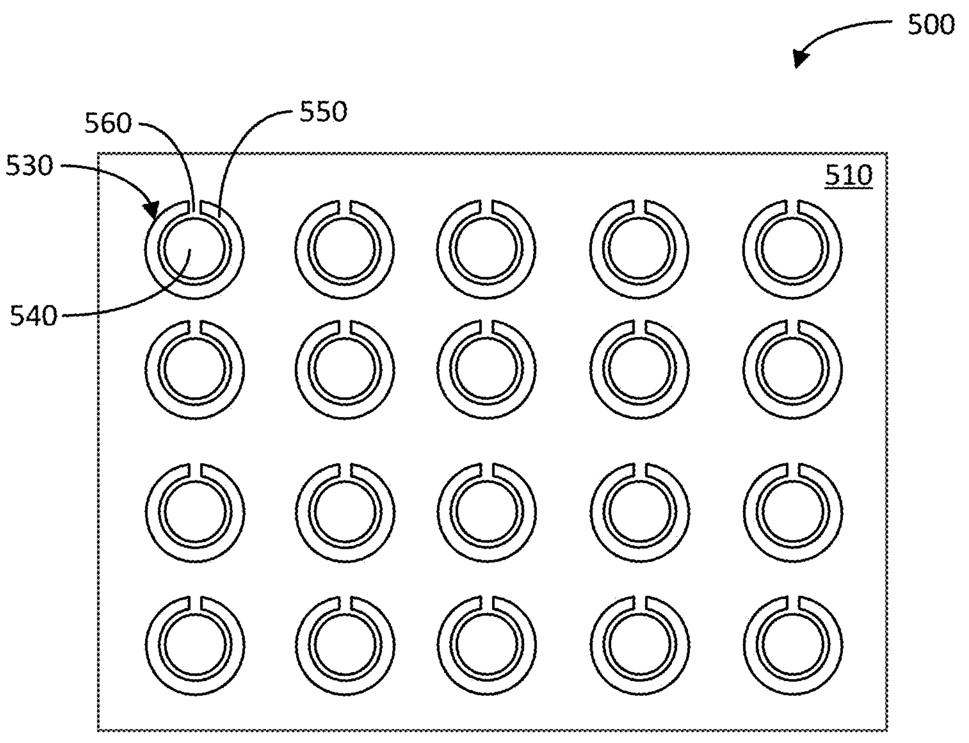
FIG. 5B illustrates a top view of an example integrated circuit (IC) package including an example array of vertical thin-film inductors (TFIs) in accordance with another aspect of the disclosure.

FIG. 5B illustrates a top view of the example IC package 500 in accordance with another aspect of the disclosure. As exemplified, the IC package 500 includes the PMIC die 510 and the at least one TFI structure 530 (e.g., a four (4) by five (5) dimensioned array of TFIs) formed over and on the PMIC die 510, as discussed with reference to FIG. 5A.

As illustrated, the first and second magnetic layers 540 and 550 are described as being semi-ring in shape because they are substantially ring shaped with vertically aligned angular gaps 560 that break their ring or circular continuity, respectively. The vertically aligned angular gaps 560 reduce the likelihood that the magnetic layers 540 and 550 exhibit flux saturation in response to alternating circuit (AC) excitation. Additionally, the magnetic materials are in layers 540 and 550, as opposed to being in a single continuous magnetic layer extending substantially from the I/O pad 515 to the solder bump or ball 570 to prevent the formation of eddy currents within the magnetic material that have a tendency to oppose the direction of magnetic flux generated by the TFI.

Although the IC package 500 includes two (2) magnetic semi-ring layers 540 and 550, it shall be understood that the IC package 500 may include a different number of magnetic semi-ring layers 540 and 550. Furthermore, it shall be understood that the magnetic layers 540 and 550 need not have circular ring shape, but may have a square, rectangle, or other semi-enclosing shape through which an electrical conducting pillar may extend to effectuate the inductance required.

Compared to the horizontally oriented TFIs of IC package 400, each of the vertically oriented TFIs of IC package 500 may occupy significantly less area on top of the IC die 510 compared to each of the horizontally oriented TFIs of IC package 400. Thus, the area above the IC die 510 may be used more efficiently with vertically oriented TFIs compared to horizontally oriented TFIs. Accordingly, given the same area on top of an IC die, higher TFI density and/or more area that may be used for other components may be achieved with the use of vertical TFIs.

Figure 6A:
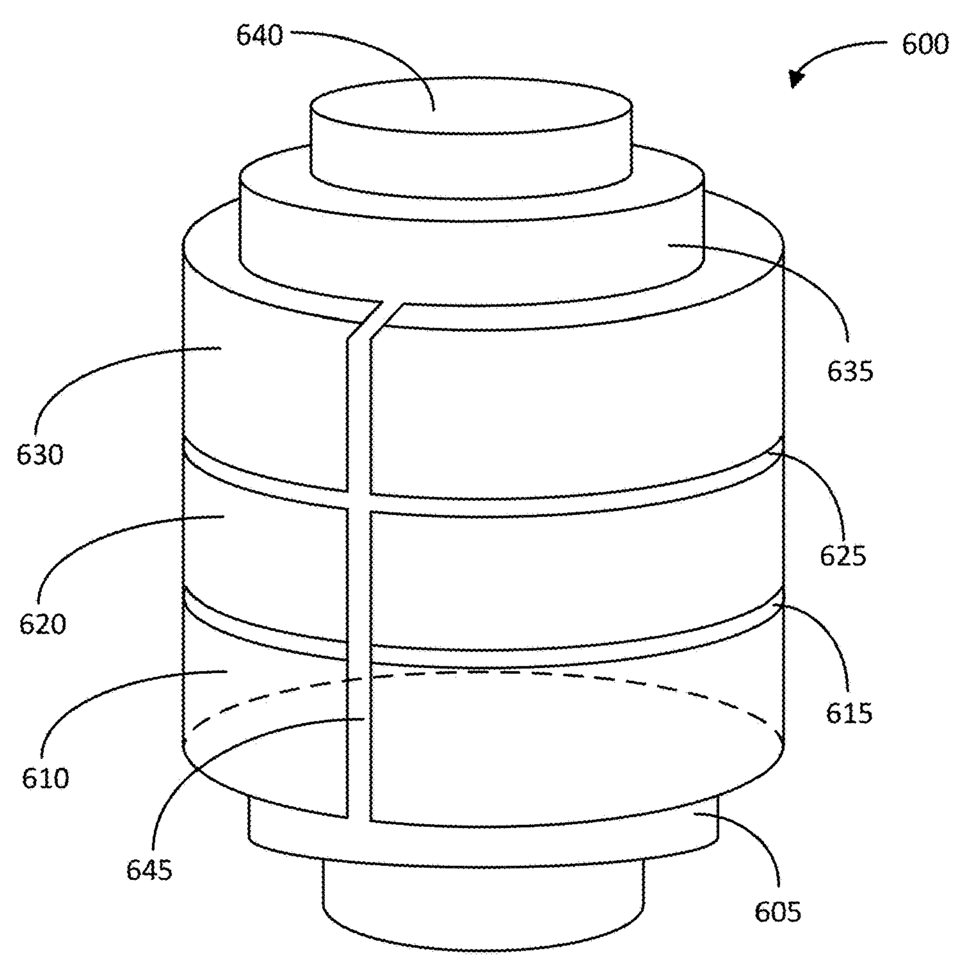
FIG. 6A illustrates a side perspective view of an example vertical thin-film inductor (TFI) in accordance with another aspect of the disclosure.

FIG. 6A illustrates a side perspective view of an example vertical thin-film inductor (TFI) 600 in accordance with another aspect of the disclosure. The vertical TFI 600 includes: a first electrical insulating (dielectric) layer 605 (e.g., $SiO_2$, $Si_3N_4$, polymer (e.g., polyimide, PBO, or other), or other); a first magnetic semi-ring layer 610 (e.g., CZT, CZTB, CZT+Ta, CZT+CZT oxide, NiFE+Ta, or other) situated over or on the first electrical insulating layer 605; and a second electrical insulating (dielectric) layer 615 (e.g., $SiO_2$, $Si_3N_4$, polymer (e.g., polyimide, PBO, or other), or other) situated over or on and coaxially within the first magnetic semi-ring layer 610.

The vertical TFI 600 further includes: a second magnetic semi-ring layer 620 (e.g., CZT, CZTB, CZT+Ta, CZT+CZT oxide, NiFE+Ta, or other) situated over or on the second electrical insulating layer 615 and above the first magnetic semi-ring layer 610 in a substantially vertically aligned manner. The second electrical insulating layer 615 electrically isolates the second magnetic semi-ring layer 620 from the first magnetic semi-ring layer 610. The vertical TFI 600 further includes a third electrical insulating (dielectric) layer 625 (e.g., $SiO_2$, $Si_3N_4$, polymer (e.g., polyimide, PBO, or other), or other) situated over or on and coaxially within the second magnetic semi-ring layer 620, and over or on the second electrical insulating layer 615.

Additionally, the vertical TFI 600 further includes: a third magnetic semi-ring layer 630 (e.g., CZT, CZTB, CZT+Ta, CZT+CZT oxide, NiFE+Ta, or other) situated over or on the third electrical insulating layer 625 and above the second magnetic semi-ring layer 620 in a substantially vertically aligned manner. The third electrical insulating layer 625 electrically isolates the third magnetic semi-ring layer 630 from the second magnetic semi-ring layer 620. The vertical TFI 600 further includes a passivation layer 635 (e.g., polymer (e.g., polyimide, PBO, or other), epoxy mold compound, or other) situated over or on and coaxially within the third magnetic semi-ring layer 630, and over or on the third electrical insulating layer 625.

The vertical TFI 600 also includes an electrical conducting pillar 640 (e.g., Cu) extending coaxially through the first electrical insulating layer 605, the coaxial first magnetic semi-ring layer 610/second electrical insulating layer 615, the coaxial second magnetic semi-ring layer 620/third electrical insulating layer 625, the coaxial third magnetic semi-ring layer 630/passivation layer 635, and the portion of the passivation layer 635 above the third magnetic semi-ring layer 630, from below and above the various layers of the vertical TFI 600. For example, the bottom of the electrical conducting pillar 640 may be coupled to an I/O pad of an IC die, and the top of the electrical conducting pillar 640 may be coupled to a solder ball or bump. As shown, the first, second, and third magnetic semi-ring layers 610, 620, and 630 collectively have a vertically aligned angular gap 645 so as to prevent magnetic flux saturation, as previously discussed. It shall be understood that the vertical TFI 600 may include more or less than three (3) magnetic semi-ring layers.

Figure 6B:
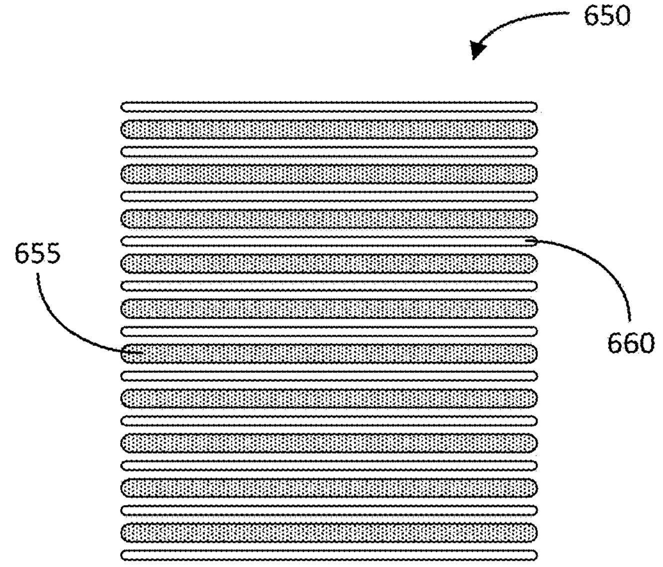
FIG. 6B illustrates a side cross-sectional view of an example magnetic layer in accordance with another aspect of the disclosure.

FIG. 6B illustrates a side cross-sectional view of an example magnetic semi-ring layer 650 in accordance with another aspect of the disclosure. The magnetic semi-ring layer 650 may be a more detailed example implementation of any of the magnetic semi-ring layers described herein.

The magnetic semi-ring layer 650 includes a stack of alternating materials 655 and 660. In one example implementation, the stack of alternating materials 655 and 660 include CZTB and Ta, respectively. In another example implementation, the stack of alternating materials 655 and 660 include CZT and CZT oxide, respectively. In yet another example implementation, the stack of alternating materials 655 and 660 include NiFe and Ta, respectively. It shall be understood that the magnetic semi-ring layer 650 may include other magnetic materials.

Figures 7A, 7B, 7C:
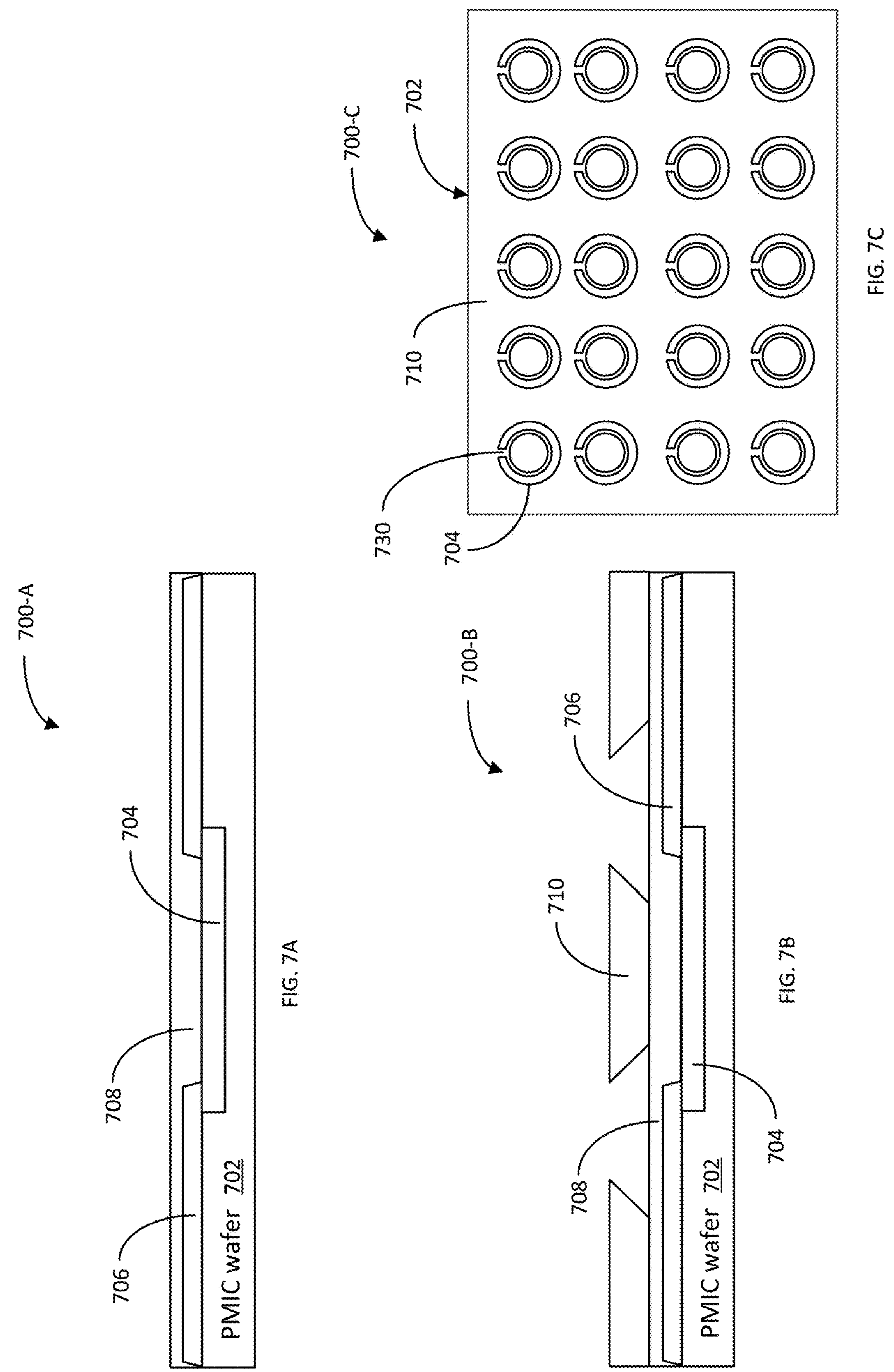
FIGS. 7A-7S illustrate cross-sectional views of an example integrated circuit (IC) package at various stages of an example fabrication method in accordance with another aspect of the disclosure.

FIG. 7A illustrates a cross-sectional view of an example integrated circuit (IC) package 700-A at early stage of an example fabrication method in accordance with another aspect of the disclosure. At this stage, the IC package 700-A includes an IC wafer or die 702 (e.g., a power management integrated circuit (PMIC) wafer and/or other). The IC wafer 702 includes an input/output (I/O) pad 704 formed at its top metal layer (e.g., the aluminum (AP) layer), and a passivation layer 706 formed over the IC wafer 702 except for a portion over the I/O pad 704. At this stage, the method of fabricating the IC package 700-A may include forming a first electrical insulating (dielectric) layer 708 (e.g., silicon oxide ($SiO_2$), silicon nitride ($Si_3N_4$), polymer (e.g., polyimide, polybenzoxazoles (PBO), or other) over the I/O pad 704 and the passivation layer 706 of the IC wafer 702. The first electrical insulating layer 708 may be formed or deposited using chemical vapor deposition (CVD).

FIG. 7B illustrates a cross-sectional view of the IC package 700-B at a following stage of the example fabrication method in accordance with another aspect of the disclosure. Following the deposition of the first electrical insulating layer 708, a photoresist 710 is formed over (e.g., spin on) the first electrical insulating layer 708, and developed to expose the first electrical insulating layer 708 at a region upon which a first magnetic semi-ring layer is to be formed. FIG. 7C illustrates a top view of an example IC package 700-C at this stage of the example fabrication method. Note that the developed photoresist masks the region over which an angular gap 730 is to be formed.

Figures 7D, 7E, 7F:
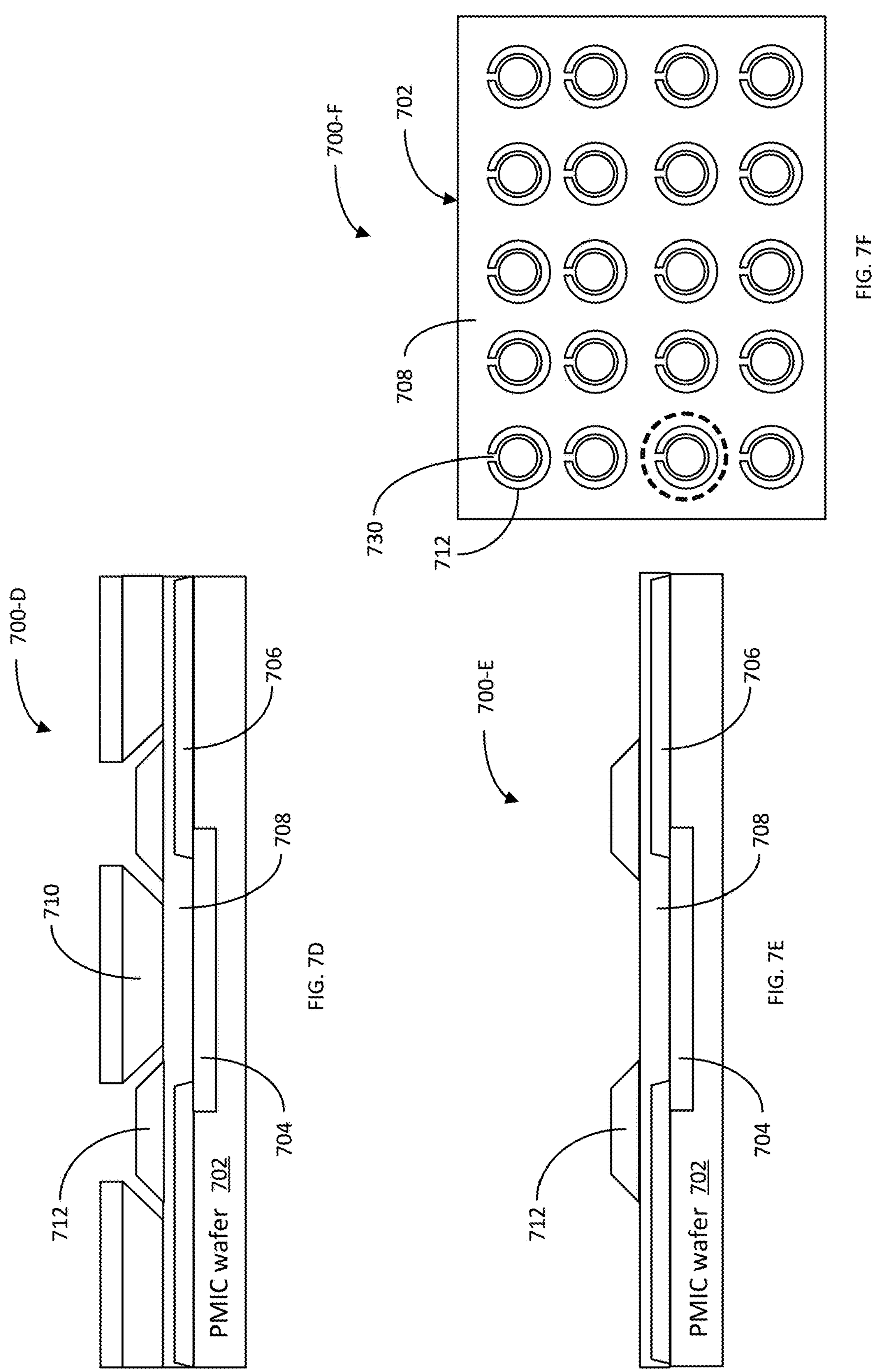

FIG. 7D illustrates a cross-sectional view of the IC package 700-D at a following stage of the example fabrication method in accordance with another aspect of the disclosure. After the development of the photoresist 710, a first magnetic material 712 (e.g., cobalt, zirconium, tantalum (CTZ), cobalt, zirconium, tantalum, boron (CZTB), CZT+tantalum (Ta), CZT+CZT oxide, nickel-iron (NiFe)+Ta, or other) is formed or deposited over the photoresist 710 and the first electrical insulating layer 708.

FIG. 7E illustrates a cross-sectional view of the IC package 700-E at a following stage of the example fabrication method in accordance with another aspect of the disclosure. After the deposition of the first magnetic material 712, the photoresist 710 is stripped; leaving behind the first magnetic semi-ring layer 712. FIG. 7F illustrates a top view of an example IC package 700-F at this stage of the example fabrication method. Note that the first magnetic semi-ring layer 712 includes the angular gap 730.

Figures 7G, 7H:
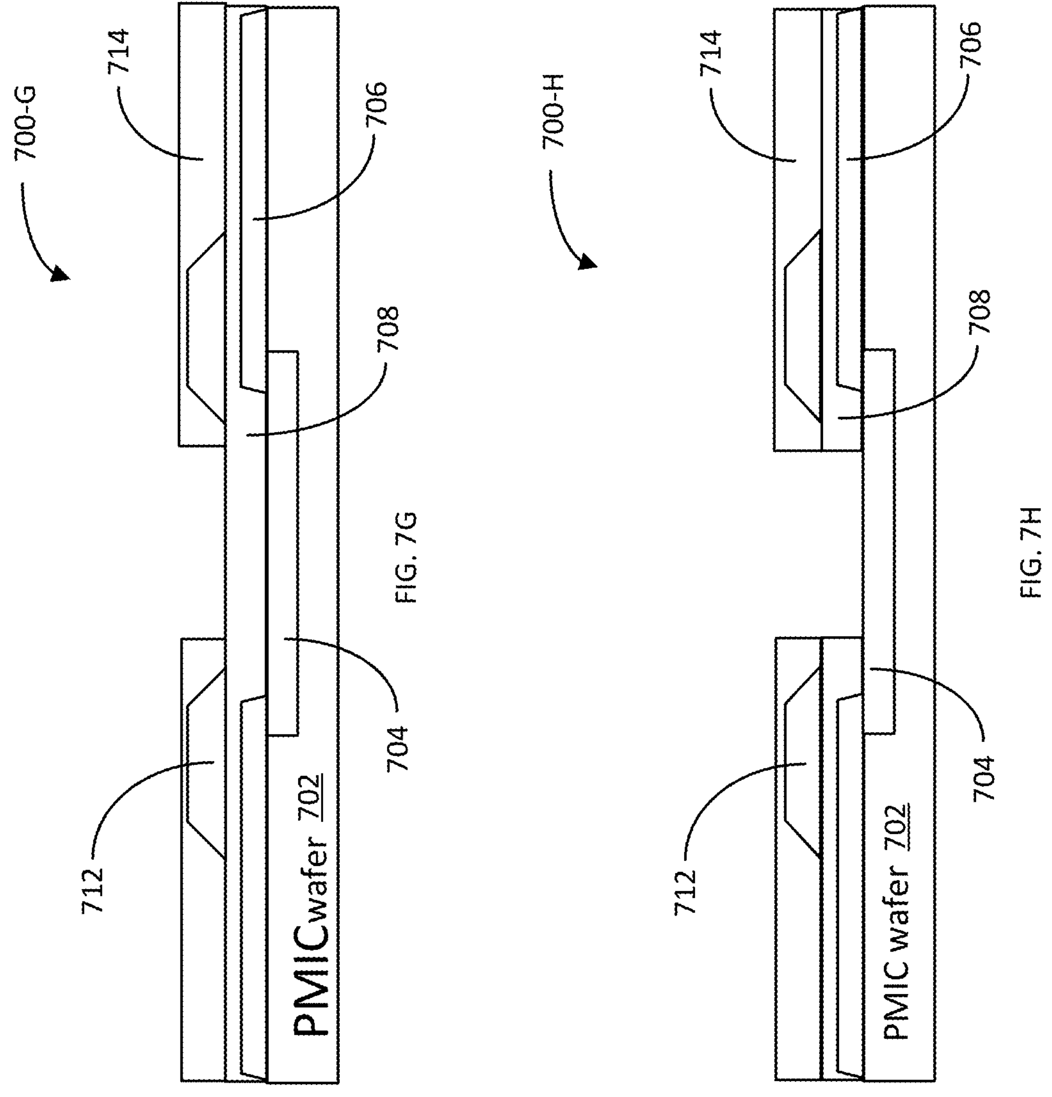

FIG. 7G illustrates a cross-sectional view of the IC package 700-G at a following stage of the example fabrication method in accordance with another aspect of the disclosure. Then, after the formation of the first magnetic semi-ring layer 712, a second electrical insulating (dielectric) layer 714 (e.g., $SiO_2$, $Si_3N_4$, polymer, or other) is formed over or deposited on the first magnetic semi-ring layer 712 and first electrical insulating layer 708, and etched to expose the portion of the first electrical insulating layer 708 directly above the I/O pad 704 of the IC wafer 702.

FIG. 7H illustrates a cross-sectional view of the IC package 700-H at a following stage of the example fabrication method in accordance with another aspect of the disclosure. The etching of the first electrical insulating layer 708 continues to expose a portion of the I/O pad 704 of the IC wafer 702. As discussed further herein, an electrical conducting pillar is formed over or on the exposed portion of the I/O pad 704 of the IC wafer 702.

Figures 7I, 7J, 7K:
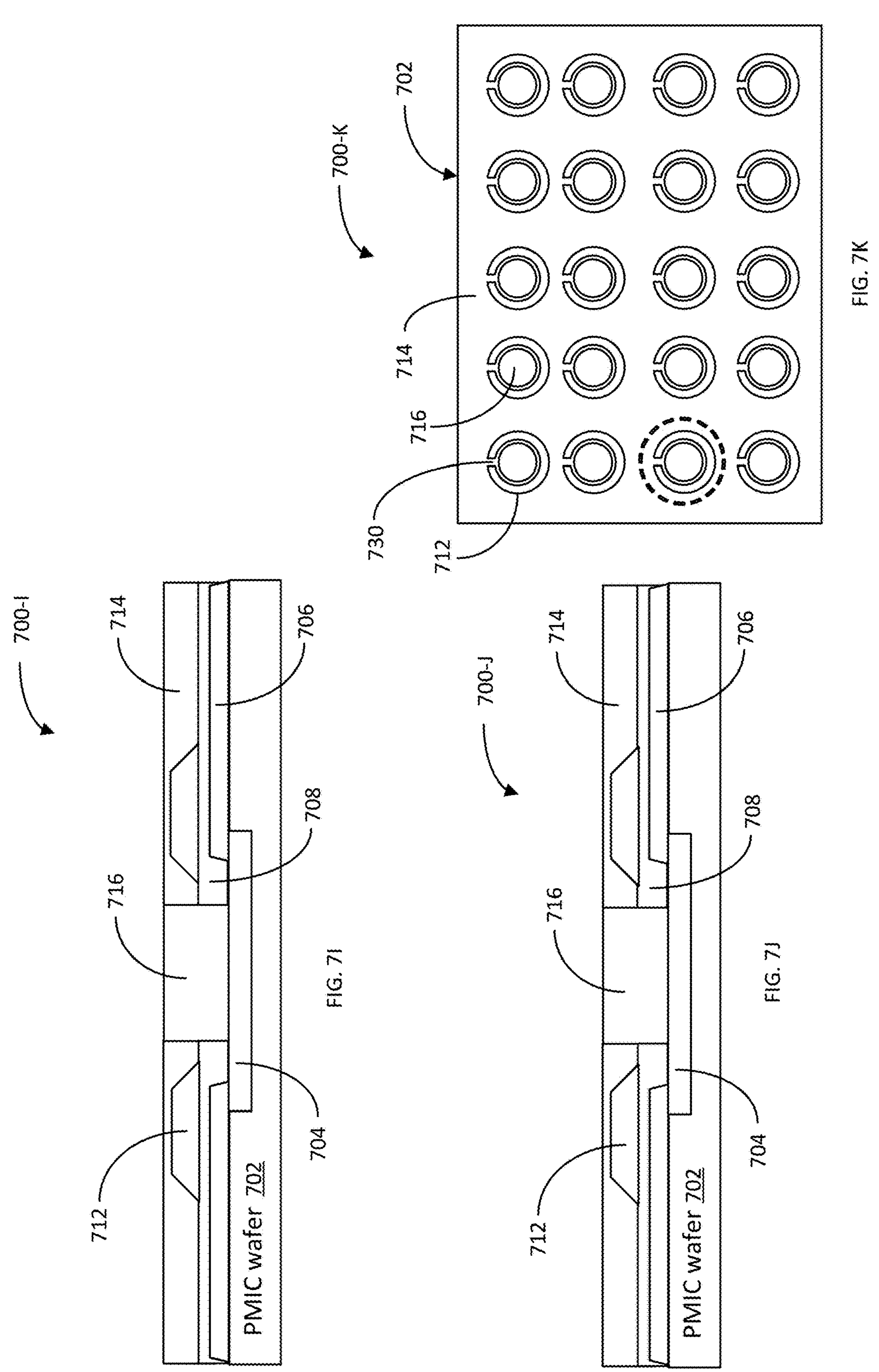

FIG. 7I illustrates a cross-sectional view of the IC package 700-I at a following stage of the example fabrication method in accordance with another aspect of the disclosure. A first (lower) portion of an electrical conducting pillar 716 (e.g., copper (Cu)) is formed over or on the I/O pad 704 of the IC wafer 702 through the first and second electrical insulating layers 708 and 714 (and coaxially through the first magnetic semi-ring layer 712). The first portion of the electrical conducting pillar 716 may be formed by forming a seed layer on the I/O pad 704, and then performing Cu plating on and above the seed layer.

FIG. 7J illustrates a cross-sectional view of the IC package 700-J at a following stage of the example fabrication method in accordance with another aspect of the disclosure. After the formation of the first portion of the electrical conducting pillar 716, the IC package 700-J, and specifically, the electrical conducting pillar 716 and the second electrical insulating layer 714, may undergo chemical mechanical planarization (CMP) to achieve a certain flatness and thickness for these layers 716 and 714. FIG. 7K illustrates a top view of an example IC package 700-K at this stage of the example fabrication method.

Figures 7L, 7M:
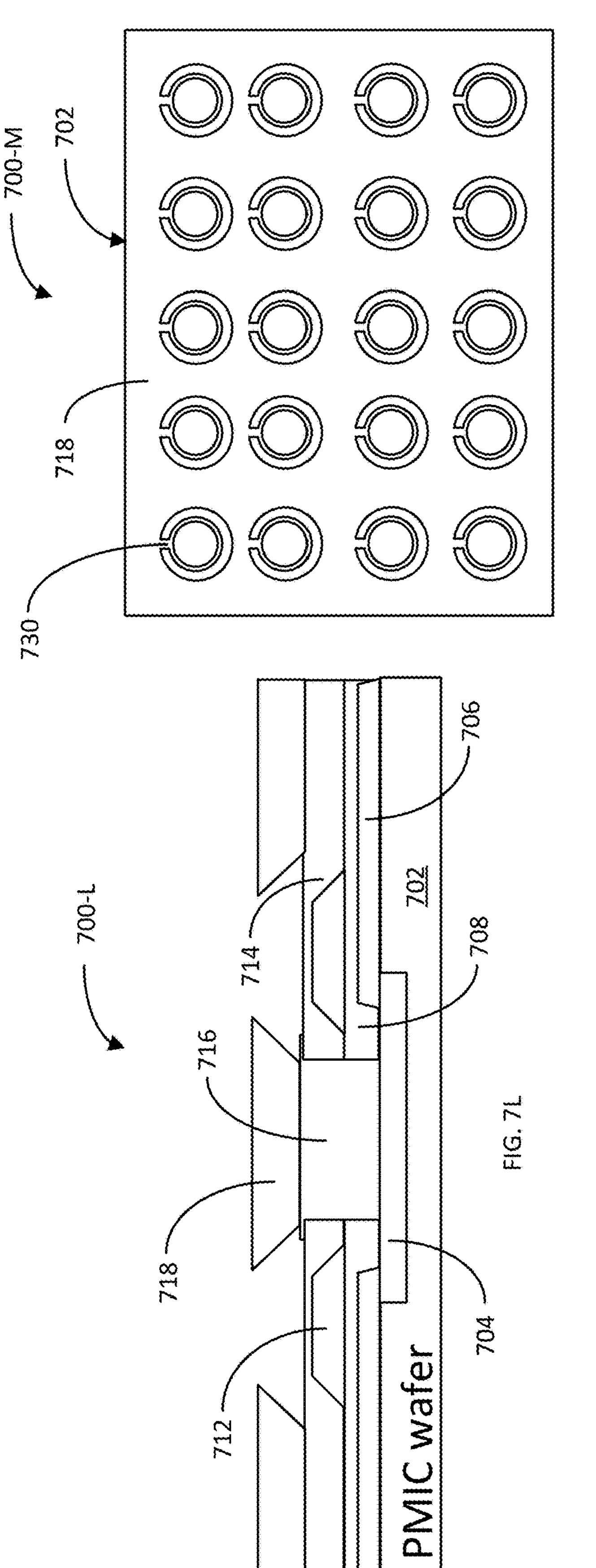

FIG. 7L illustrates a cross-sectional view of the IC package 700-L at a following stage of the example fabrication method in accordance with another aspect of the disclosure. Following the CMP of the IC package 700-J, a photoresist 718 is formed over (e.g., spin on) the second electrical insulating layer 714 and the electrical conducting pillar 716, and developed to expose the second electrical insulating layer 714 at a region upon which a second magnetic semi-ring layer is to be formed. FIG. 7M illustrates a top view of an example IC package 700-M at this stage of the example fabrication method.

Figures 7N, 7O:
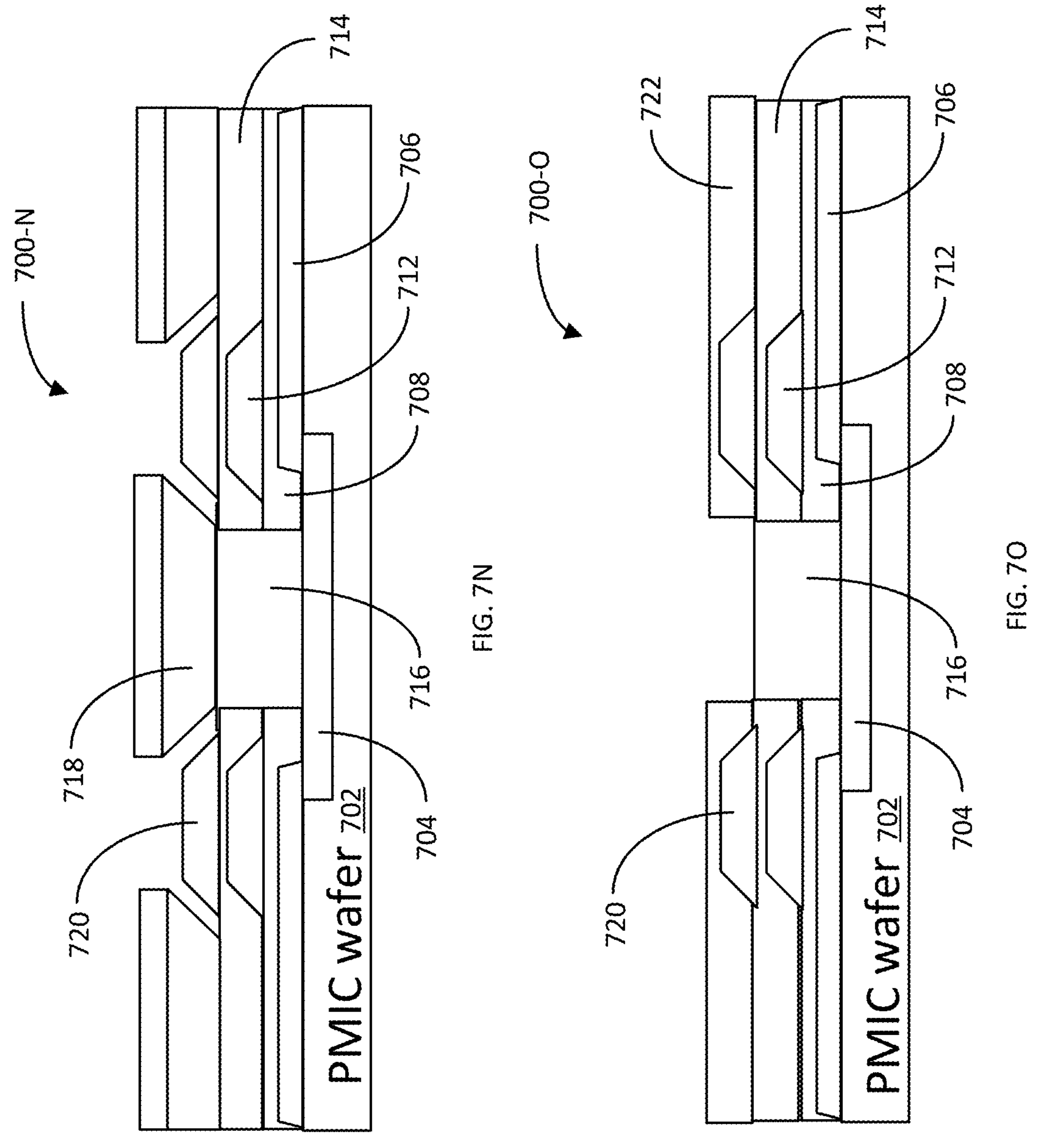

FIG. 7N illustrates a cross-sectional view of the IC package 700-N at a following stage of the example fabrication method in accordance with another aspect of the disclosure. After the development of the photoresist 718, a second magnetic material 720 (e.g., CZT, CZTB, CZT+Ta, CZT+CZT oxide, NiFE+Ta, or other) is formed or deposited over the photoresist 718 and the second electrical insulating layer 714.

FIG. 7O illustrates a cross-sectional view of the IC package 700-O at a following stage of the example fabrication method in accordance with another aspect of the disclosure. After the deposition of the second magnetic material 720, the photoresist 718 is stripped; leaving behind the second magnetic semi-ring layer 720, vertically and coaxially aligned with the first magnetic semi-ring layer 712. If more vertically and coaxially aligned magnetic semi-ring layers are to be formed, the process as discussed with reference to FIGS. 7L-7N may be repeated to form the additional magnetic layers as desired. Then, a passivation layer 722 (e.g., polymer, epoxy mold compound, or other) is formed over the second magnetic semi-ring layer 720 and the second electrical insulating layer 714, and etched to expose the electrical conducting pillar 716.

Figures 7P, 7Q:
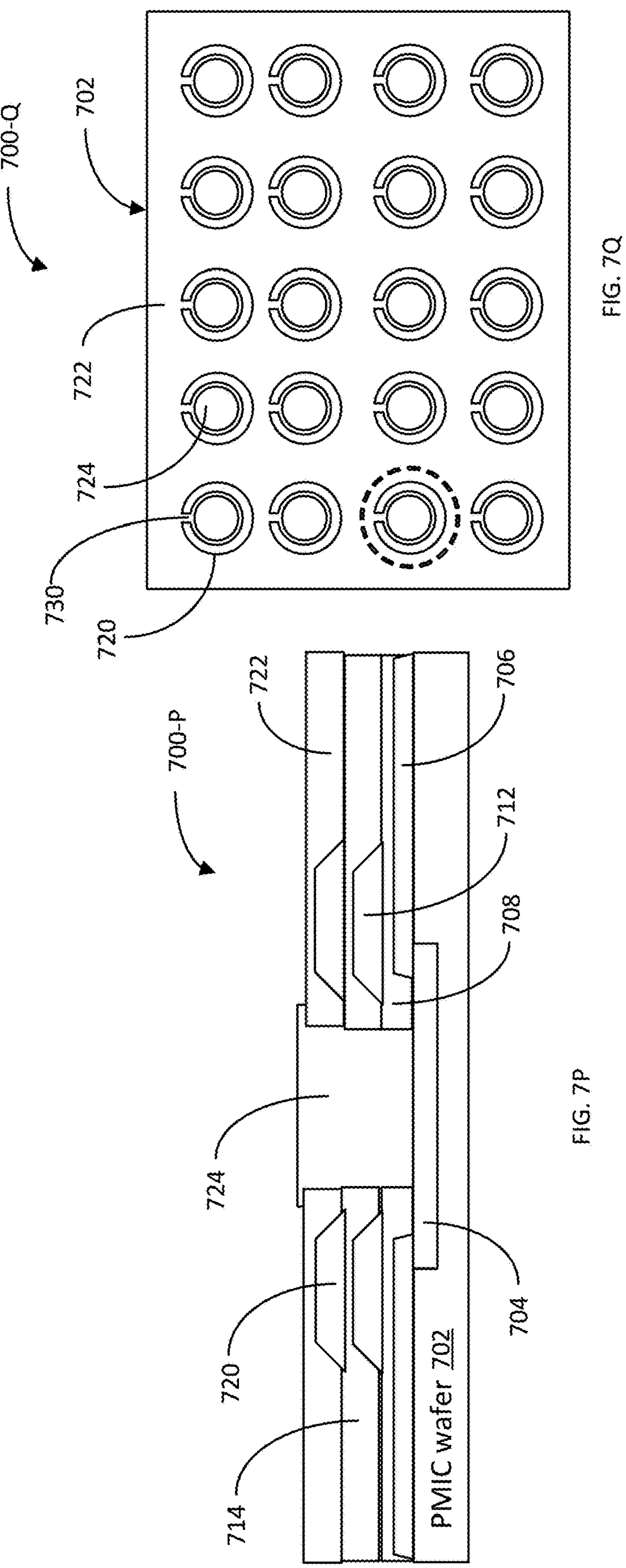

FIG. 7P illustrates a cross-sectional view of the IC package 700-P at a following stage of the example fabrication method in accordance with another aspect of the disclosure. The IC package 700-P undergoes another metallization deposition or plating to form the second (e.g., upper or remaining) portion of or the entire electrical conducting pillar 724 through and on the passivation layer 722 (and coaxially through the second magnetic semi-ring layer 720). FIG. 7Q illustrates a top view of an example IC package 700-Q at this stage of the example fabrication method.

Figures 7R, 7S:
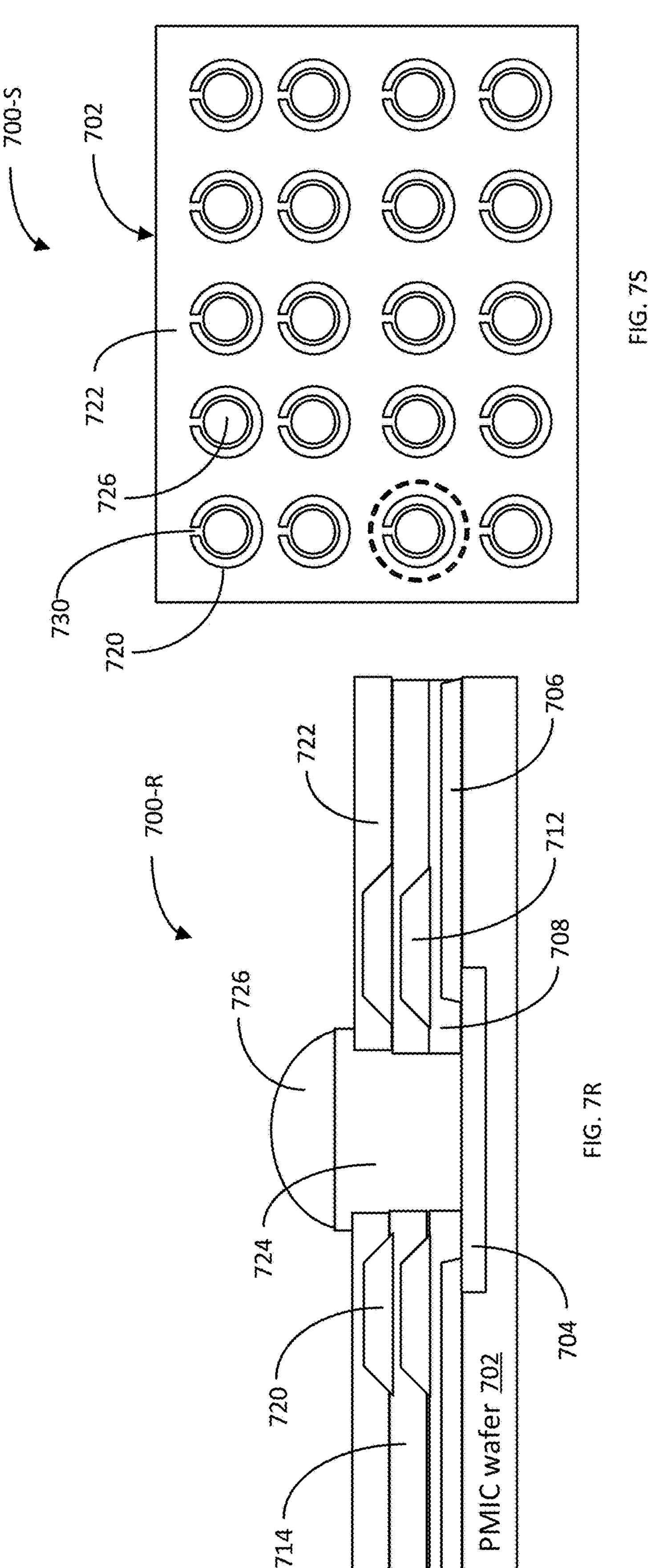

FIG. 7R illustrates a cross-sectional view of the IC package 700-R at a following stage of the example fabrication method in accordance with another aspect of the disclosure. Then, according to the fabrication method, a solder bump or ball 726 is formed over the electrical conducting pillar 724. FIG. 7S illustrates a top view of an example IC package 700-S at this stage of the example fabrication method.

The following provides an overview of aspects of the present disclosure:

Aspect 1: An integrated circuit (IC) package, comprising: an integrated circuit (IC) die including an input/output (I/O) pad; and a vertical thin-film inductor (TFI) extending vertically substantially from the I/O pad to a solder bump.

Aspect 2: The IC package of aspect 1, wherein the vertical TFI comprises an electrical conducting pillar extending vertically substantially from the I/O pad to the solder bump.

Aspect 3: The IC package of aspect 2, wherein the electrical conducting pillar comprises copper.

Aspect 4: The IC package of aspect 2 or 3, wherein the vertical TFI further comprises a first magnetic semi-ring layer electrically isolated from the electrical conducting pillar, wherein the electrical conducting pillar extends coaxially through the first magnetic semi-ring layer.

Aspect 5: The IC package of aspect 4, wherein the first magnetic semi-ring layer comprises cobalt, zirconium, tantalum (CTZ), cobalt, zirconium, tantalum, boron (CZTB), CZT+tantalum (Ta), CZT+CZT oxide, or nickel-iron (NiFe)+Ta.

Aspect 6: The IC package of aspect 4 or 5, wherein the first magnetic semi-ring layer comprises a stack of alternating material layers.

Aspect 7: The IC package of aspect 6, wherein the stack of alternating material layers comprises CZTB and Ta, CZT and CZT oxide, or NiFE and Ta.

Aspect 8: The IC package of any one of aspects 4 to 7, wherein the first magnetic semi-ring layer includes a first angular gap.

Aspect 9: The IC package of any one of aspects 4 to 8, wherein the vertical TFI further comprises a second magnetic semi-ring layer electrically isolated from the first magnetic semi-ring layer and the electrical conducting pillar, wherein the electrical conducting pillar extends coaxially through the second magnetic semi-ring layer.

Aspect 10: The IC package of aspect 9, wherein the second magnetic semi-ring layer comprises CTZ, CZTB, CZT+Ta, CZT+CZT oxide, or NiFe+Ta.

Aspect 11: The IC package of aspect 9, wherein the second magnetic semi-ring layer comprises a stack of alternating material layers.

Aspect 12: The IC package of aspect 11, wherein the stack of alternating material layers comprises CZTB and Ta, CZT and CZT oxide, or NiFE and Ta.

Aspect 13: The IC package of any one of aspects 9 to 12, wherein: the first magnetic semi-ring layer includes a first angular gap; and the second magnetic semi-ring layer includes a second angular gap.

Aspect 14: The IC package of aspect 13, wherein the first and second angular gaps are substantially vertically aligned.

Aspect 15: The IC package of any one of aspects 9-14, wherein the vertical TFI further comprises an electrical insulating layer electrically isolating the first magnetic semi-ring layer from the second magnetic semi-ring layer.

Aspect 16: The IC package of claim 15, wherein the electrical insulating layer comprises silicon oxide ($SiO_2$), silicon nitride ($Si_3N_4$), or a polymer.

Aspect 17: The IC package of any one of aspects 9 to 16, wherein the vertical TFI further comprises an electrical insulating layer electrically isolating the first and second magnetic semi-ring layers from the electrical conducting pillar.

Aspect 18: The IC package of aspect 17, wherein the electrical insulating layer comprises silicon oxide ($SiO_2$), silicon nitride ($Si_3N_4$), or a polymer.

Aspect 19: The IC package of any one of aspects 2 to 18, further comprising a passivation layer coaxially surrounding the electrical conducting pillar.

Aspect 20: The IC package of aspect 19, wherein the passivation layer comprises a polymer or an epoxy mold compound.

Aspect 21: The IC package of aspect 20, wherein the polymer comprises polyimide or polybenzoxazoles (PBO).

Aspect 22: A method of fabricating an integrated circuit (IC) package, comprising: providing an integrated circuit (IC) including an input/output (I/O) pad; forming a vertical thin-film inductor (TFI) extending vertically from substantially the I/O pad; and forming a solder bump over the vertical TFI.

Aspect 23: The method of aspect 22, wherein forming the vertical TFI comprises forming an electrical conducting pillar extending vertically from substantially the I/O pad to the solder bump.

Aspect 24: The method of aspect 23, further comprising forming a first magnetic semi-ring layer coaxially surrounding and electrically isolated from the electrical conducting pillar.

Aspect 25: The method of aspect 24, wherein the first magnetic semi-ring layer includes a first angular gap.

Aspect 26: The method of aspect 24 or 25, further comprising forming a second magnetic semi-ring layer coaxially surrounding and electrically isolated from the electrical conducting pillar, wherein the second magnetic semi-ring layer is substantially vertically aligned above and electrically isolated from the first magnetic semi-ring layer.

Aspect 27: The method of aspect 26, wherein: the first magnetic semi-ring layer includes a first angular gap; and the second magnetic semi-ring layer includes a second angular gap.

Aspect 28: The method of aspect 27, wherein the first and second angular gaps are substantially vertically aligned.

Aspect 29: The method of any one of aspects 26 to 28, wherein at least one of the first or second magnetic semi-ring layer each comprises cobalt, zirconium, tantalum (CTZ), cobalt, zirconium, tantalum, boron (CZTB), CZT+tantalum (Ta), CZT+CZT oxide, or nickel-iron (NiFe)+Ta.

Aspect 30: The method of any one of aspects 26 to 28, wherein at least one of the first or second magnetic semi-ring layer comprises a stack of alternating material layers including CZTB and Ta, CZT and CZT oxide, or NiFE and Ta.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples described herein but is to be accorded the widest scope consistent with the principles and novel features disclosed herein.

What is claimed:

1. An integrated circuit (IC) package, comprising:

an integrated circuit (IC) die including an input/output (I/O) pad; and a vertical thin-film inductor (TFI) extending vertically substantially from the I/O pad to a solder bump, wherein the vertical TFI comprises an electrical conducting pillar extending vertically substantially from the I/O pad to a solder bump, and wherein the vertical TFI further comprises a first magnetic semi-ring layer electrically isolated from the electrical conducting pillar, wherein the electrical conducting pillar extends coaxially through the first magnetic semi-ring layer.

2. The IC package of claim 1, wherein the electrical conducting pillar comprises copper.

3. The IC package of claim 1, wherein the first magnetic semi-ring layer comprises cobalt, zirconium, tantalum (CTZ), cobalt, zirconium, tantalum, boron (CZTB), CZT+tantalum (Ta), CZT+CZT oxide, or nickel-iron (NiFe)+Ta.

4. The IC package of claim 1, wherein the first magnetic semi-ring layer comprises a stack of alternating material layers.

5. The IC package of claim 4, wherein the stack of alternating material layers comprises CZTB and Ta, CZT and CZT oxide, or NiFE and Ta.

6. The IC package of claim 1, wherein the first magnetic semi-ring layer includes a first angular gap.

7. The IC package of claim 1, wherein the vertical TFI further comprises a second magnetic semi-ring layer electrically isolated from the first magnetic semi-ring layer and the electrical conducting pillar, wherein the electrical conducting pillar extends coaxially through the second magnetic semi-ring layer.

8. The IC package of claim 7, wherein the second magnetic semi-ring layer comprises CTZ, CZTB, CZT+Ta, CZT+CZT oxide, or NiFe+Ta.

9. The IC package of claim 7, wherein the second magnetic semi-ring layer comprises a stack of alternating material layers.

10. The IC package of claim 9, wherein the stack of alternating material layers comprises CZTB and Ta, CZT and CZT oxide, or NiFE and Ta.

11. The IC package of claim 7, wherein:

the first magnetic semi-ring layer includes a first angular gap; and the second magnetic semi-ring layer includes a second angular gap.

12. The IC package of claim 11, wherein the first and second angular gaps are substantially vertically aligned.

13. The IC package of claim 7, wherein the vertical TFI further comprises an electrical insulating layer electrically isolating the first magnetic semi-ring layer from the second magnetic semi-ring layer.

14. The IC package of claim 13, wherein the electrical insulating layer comprises silicon oxide ($SiO_2$), silicon nitride ($Si_3N_4$), or a polymer.

15. The IC package of claim 7, wherein the vertical TFI further comprises an electrical insulating layer electrically isolating the first and second magnetic semi-ring layers from the electrical conducting pillar.

16. The IC package of claim 15, wherein the electrical insulating layer comprises silicon oxide ($SiO_2$), silicon nitride ($Si_3N_4$), or a polymer.

17. The IC package of claim 1, further comprising a passivation layer coaxially surrounding the electrical conducting pillar.

18. The IC package of claim 17, wherein the passivation layer comprises a polymer or an epoxy mold compound.

19. The IC package of claim 18, wherein the polymer comprises polyimide or polybenzoxazoles (PBO).

20. A method of fabricating an integrated circuit (IC) package, comprising:

providing an integrated circuit (IC) including an input/output (I/O) pad;

forming a vertical thin-film inductor (TFI) extending vertically from substantially the I/O pad, wherein forming the vertical TFI comprises forming an electrical conducting pillar extending vertically from substantially the I/O pad to the solder bump;

forming a solder bump over the vertical TFI; and forming a first magnetic semi-ring layer coaxially surrounding and electrically isolated from the electrical conducting pillar.

21. The method of claim 20, wherein the first magnetic semi-ring layer includes a first angular gap.

22. The method of claim 20, further comprising forming a second magnetic semi-ring layer coaxially surrounding and electrically isolated from the electrical conducting pillar, wherein the second magnetic semi-ring layer is substantially vertically aligned above and electrically isolated from the first magnetic semi-ring layer.

23. The method of claim 22, wherein at least one of the first or second magnetic semi-ring layer each comprises cobalt, zirconium, tantalum (CTZ), cobalt, zirconium, tantalum, boron (CZTB), CZT+tantalum (Ta), CZT+CZT oxide, or nickel-iron (NiFe)+Ta.

24. The method of claim 22, wherein at least one of the first or second magnetic semi-ring layer comprises a stack of alternating material layers including CZTB and Ta, CZT and CZT oxide, or NiFE and Ta.

25. The method of claim 22, wherein:

the first magnetic semi-ring layer includes a first angular gap; and the second magnetic semi-ring layer includes a second angular gap.

26. The method of claim 25, wherein the first and second angular gaps are substantially vertically aligned.

* * * * *